(12) United States Patent
Partlo et al.

(10) Patent No.: US 6,738,410 B2
(45) Date of Patent: May 18, 2004

(54) LINE NARROWED LASER WITH BIDIRECTION BEAM EXPANSION

(75) Inventors: William N. Partlo, Poway, CA (US); Alexander I. Ershov, San Diego, CA (US); Scott T. Smith, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 200 days.

(21) Appl. No.: 09/738,042

(22) Filed: Dec. 15, 2000

(65) Prior Publication Data

US 2001/0014110 A1 Aug. 16, 2001

Related U.S. Application Data

(63) Continuation-in-part of application No. 09/716,041, filed on Nov. 17, 2000, and a continuation-in-part of application No. 09/470,724, filed on Dec. 22, 1999, now Pat. No. 6,192,064.

(51) Int. Cl.$^7$ .................................................. H01S 3/08
(52) U.S. Cl. ........................ 372/100; 372/20; 372/98; 372/102
(58) Field of Search .......................... 372/100, 20, 102, 372/57, 98, 107

(56) References Cited

U.S. PATENT DOCUMENTS

| 3,734,599 | A | * | 5/1973 | Feldman | 359/710 |
|---|---|---|---|---|---|
| 4,951,285 | A | | 8/1990 | Cole et al. | 372/20 |
| 4,991,178 | A | | 2/1991 | Wani et al. | 372/20 |
| 5,095,492 | A | | 3/1992 | Sandstrom | 372/102 |
| 5,249,192 | A | | 9/1993 | Kuizenga et al. | 372/20 |
| 5,761,236 | A | | 6/1998 | Kleinschmidt et al. | 372/20 |
| 5,856,991 | A | | 1/1999 | Ershov | 372/20 |
| 5,901,163 | A | * | 5/1999 | Ershov | 372/100 |
| 5,970,082 | A | * | 10/1999 | Ershov | 372/102 |
| 5,978,409 | A | * | 11/1999 | Das et al. | 372/100 |
| 6,014,361 | A | * | 1/2000 | Nagashima et al. | 369/112.28 |
| 6,014,398 | A | * | 1/2000 | Hofmann et al. | 372/100 |
| 6,094,448 | A | * | 7/2000 | Fomenkov et al. | 372/102 |
| 6,137,821 | A | * | 10/2000 | Ershov | 372/100 |
| 6,192,064 | B1 | * | 2/2001 | Algots et al. | 372/99 |
| 6,212,217 | B1 | * | 4/2001 | Erie et al. | 372/102 |
| 6,493,374 | B1 | * | 12/2002 | Fomenkov et al. | 372/102 |
| 2002/0006147 | A1 | * | 1/2002 | Cybulski et al. | 372/55 |
| 2002/0127497 | A1 | * | 9/2002 | Brown et al. | 430/321 |

FOREIGN PATENT DOCUMENTS

| JP | 04-314374 | 11/1992 |
|---|---|---|
| JP | 05-167172 | 2/1993 |

OTHER PUBLICATIONS

P. Zorabedian, Characteristics of a Grating–External–Cavity Semiconductor Laser Containing Intracavity Prism Beam Expanders, IEEE, Journal of Lightwave Technology, vol. 10, No. 3, Mar. 1992.*

* cited by examiner

Primary Examiner—T. Thomas
Assistant Examiner—José R. Diaz
(74) Attorney, Agent, or Firm—William Cray (57) ABSTRACT

A grating based line narrowing unit with bi-directional beam expansion for line narrowing lasers. In a preferred embodiment a beam from the chamber of the laser is expanded in the horizontal direction with a three-prism beam expander and is expanded in the vertical direction with a single prism. A narrow band of wavelengths in the expanded beam is reflected from a grating in a Littrow configuration back via the two beam expanders into the laser chamber for amplification.

10 Claims, 11 Drawing Sheets

FIG.8D

LINE NARROWED LASER WITH BIDIRECTION BEAM EXPANSION

This invention relates to lasers and in particular to line narrowed excimer lasers. This invention is a continuation-in-part of Ser. No. 09/470,724, filed Dec. 22, 1999 now U.S. Pat. No. 6,192,064 and Ser. No. 09/716,041, filed Nov. 17, 2000.

BACKGROUND OF THE INVENTION

Narrow Band Gas Discharge Lasers

Gas discharge ultraviolet lasers used as light sources for integrated circuit lithography typically are line narrowed. A preferred line narrowing prior art technique is to use a diffraction grating based line narrowing unit along with an output coupler to form the laser resonant cavity. The gain medium within this cavity is produced by electrical discharges into a circulating laser gas such as krypton, fluorine and neon (for a KrF laser); argon, fluorine and neon (for an ArF laser); or fluorine and helium and/or neon (for an $F_2$ laser).

Prior Art Line-Narrowing Technique

Figure 1:
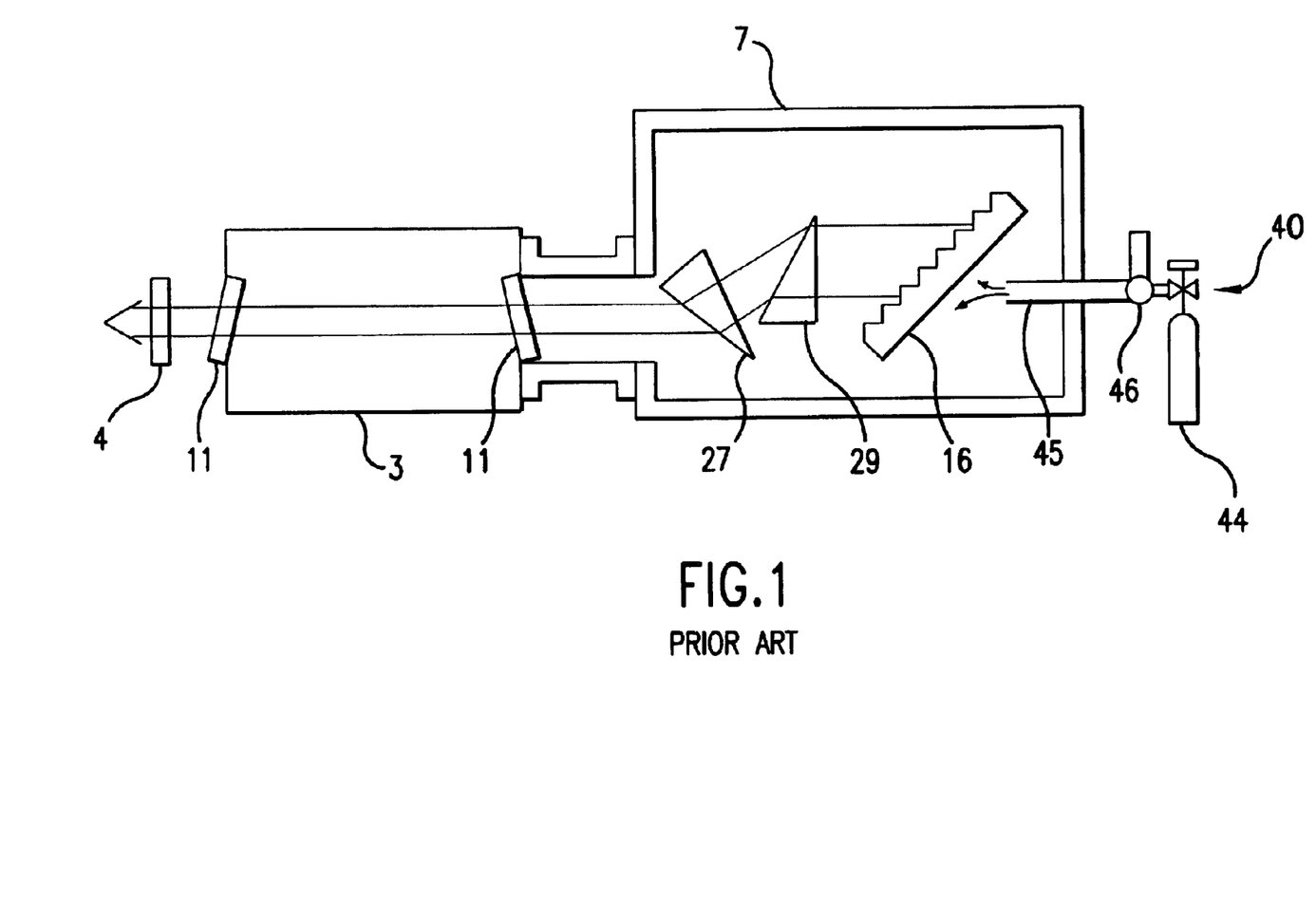
FIG. 1 shows a first prior art line narrowed laser system.

A sketch of such a prior art system is shown in FIG. 1 which is extracted from Japan Patent No. 2,696,285. The system shown includes output coupler (or front mirror) 4, laser chamber 3, chamber windows 11, and a grating based line narrowing unit 7. The line narrowing unit 7 is typically provided on a lithography laser system as an easily replaceable unit and is sometimes called a "line narrowing package" or "LNP" for short. This unit includes two beam expanding prisms 27 and 29 and a grating 16 disposed in a Litrow configuration so that diffracted beam propagates right back towards the incoming beam. The output of these excimer lasers are typically rectangular with the long dimension of for example 20 mm in the vertical direction and a short dimension of for example 3 mm in the horizontal direction. Therefore, in prior art designs, the beam is typically expanded in the horizontal direction so that the FIG. 1 drawing would represent a top view.

The Grating Formula

Figure 2:
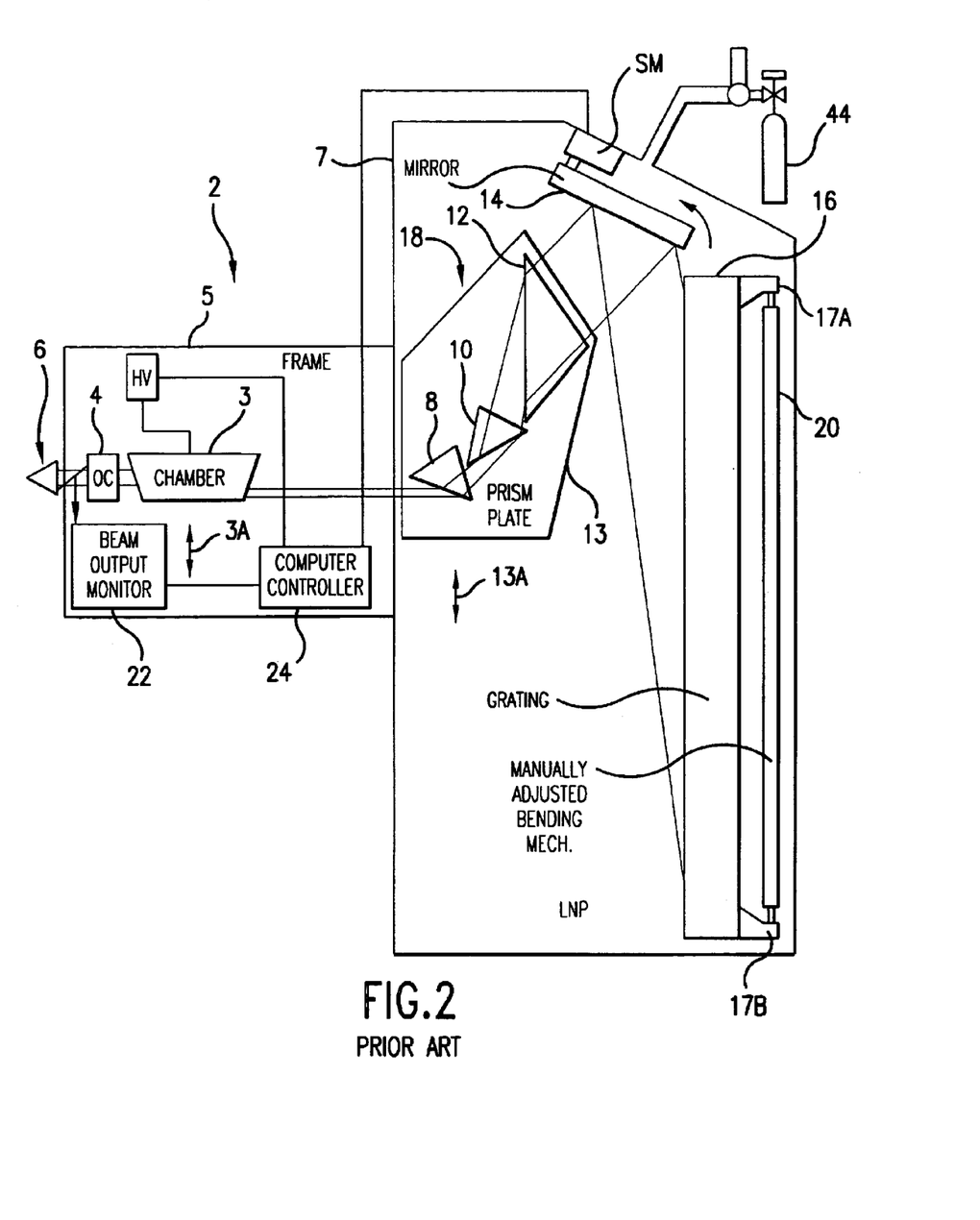
FIG. 2 shows a second prior art line narrowed laser system.

Another prior art excimer laser system utilizing a diffraction grating for spectrum line selection is shown in FIG. 2. The cavity of the laser is created by an output coupler 4 and a grating 16, which works as a reflector and a spectral selective element. Output coupler 4 reflects a portion of the light back to the laser and transmits the other portion 6 which is the output of the laser. Prisms 8, 10 and 12 form a beam expander, which expands the beam in the horizontal direction before it illuminates the grating. A mirror 14 is used to steer the beam as it propagates towards the grating, thus controlling the horizontal angle of incidence. The laser central wavelength is normally changed (tuned) by turning very slightly that mirror 14. A gain generation is created in chamber 3.

Diffraction grating 16 provides the wavelength selection by reflecting light with different wavelengths at different angles. Because of that only those light rays which are reflected back into the laser will be amplified by the laser gain media, while all other light with different wavelengths will be lost.

The diffraction grating in this prior art laser works in a Littrow configuration, when it reflects light back into the laser. For this configuration, the incident angle α and the wavelength λ are related through the formula:

$$2dn\sin\alpha = m\lambda \quad (1)$$

where α is the incidence angle on the grating, m is the diffraction order, n is refractive index of gas, and d is the period of the grating.

Because microlithography exposure lenses are very sensitive to chromatic aberration of the light source, it is required that the laser produce light with very narrow spectrum line width. For example, state of the art excimer lasers are now producing spectral line widths on the order of 0.5 pm as measured at full width at half maximum values and with 95% oldie light energy concentrated in the range of about 1.5 pm. New generations of microlithography exposure tools will require even tighter spectral requirements. In addition, it is very important that the laser central wavelength be maintained to very high accuracy as well. In practice it is required that the central wavelength is maintained to better than 0.05–0.1 pm stability.

A need exists for greater narrowing of the laser beam.

SUMMARY OF THE INVENTION

The present invention provides for a grating based line narrowing unit with bi-directional beam expansion for line narrowing lasers. In a preferred embodiment a beam from the chamber of the laser is expanded in the horizontal direction with a three-prism beam expander and is expanded in the vertical direction with a single prism. A narrow band of wavelengths in the expanded beam is reflected from a grating in a Littrow configuration back via the two beam expanders into the laser chamber for amplification.

DETAILED DESCRIPTION OF PREFERRED EMBODIMENTS

Preferred embodiments of the present invention can be described by reference to the drawings. In this description and in the claims the term "horizontal" shall have the normal dictionary meaning (i.e., parallel to the horizon). Horizon means the "apparent junction of earth and sky". The term "vertical" shall also have the ordinary dictionary meaning of "perpendicular to the plane of the horizon".

In reality, formula (1) presented in the Background Section only works when all the beams incident on the grating have the same direction in the vertical axes, and this direction is normal to diffraction grating grooves. Diffraction grating grooves are placed vertically so formula (1) works for beams which lay in the horizontal plane.

Real excimer laser beams, however, have some divergence in both horizontal and vertical directions. In this case, formula (1) is modified and becomes $$2dn\sin\alpha \cdot \cos\beta = m\lambda \quad (2)$$

In this formula, β is the beam angle in the vertical direction, the rest of the variables are the same as in (1). In the case of β=0; i.e., when the beam has no divergence in the vertical direction, cosβ=1 and formula (2) becomes (1).

It is important to note, that grating does not have any dispersion properties in the vertical direction, that is, its reflection angle in the vertical direction does not depend on the light wavelength, but is rather equal to the incident angle. That means, in the vertical direction the reflecting facets of the grating face are behaving like ordinary mirrors.

Figure 3:
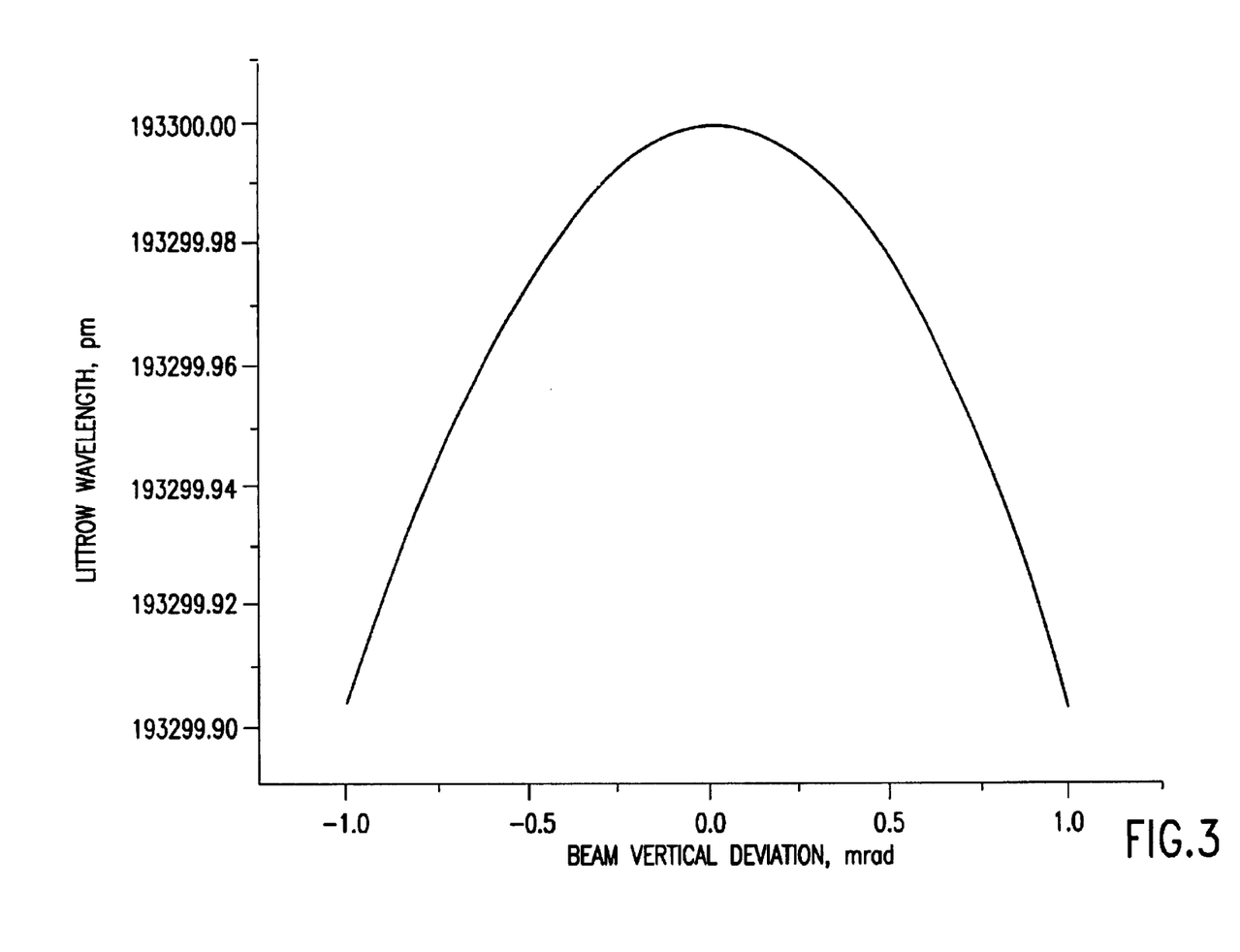
FIG. 3 shows the effect on wavelengths of vertical beam deviation.

Beam divergence in the vertical direction has significant effect on line narrowing. According to formula (2), different vertical angles β would correspond to different Littrow wavelengths λ. FIG. 3 shows dependence of Littrow wavelength λ on the beam vertical deviation, β. Typical prior art excimer laser might have a beam divergence of up to ±1.0 mrad (i.e., a total beam divergence of about 2 mrad). FIG. 3 shows that a portion of a beam propagating with a 1 mrad vertical tilt (in either up or down direction) will have the Littrow wavelength shifted by 0.1 pm to the short wavelength direction for that portion of the beam. This wavelength shift leads to broadening of the whole beam spectrum. Prior art excimer lasers, having $\Delta\lambda_{FWHM}$ bandwidth of about 0.6 pm does not substantially suffer from this effect. However, as the bandwidth is reduced, this 0.1 pm shift becomes more important. New excimer laser specifications for microlithography will require bandwidth of about 0.4 pm or less. In this case, it becomes important to reduce this broadening effect.

First Preferred Embodiment

Figure 4A:
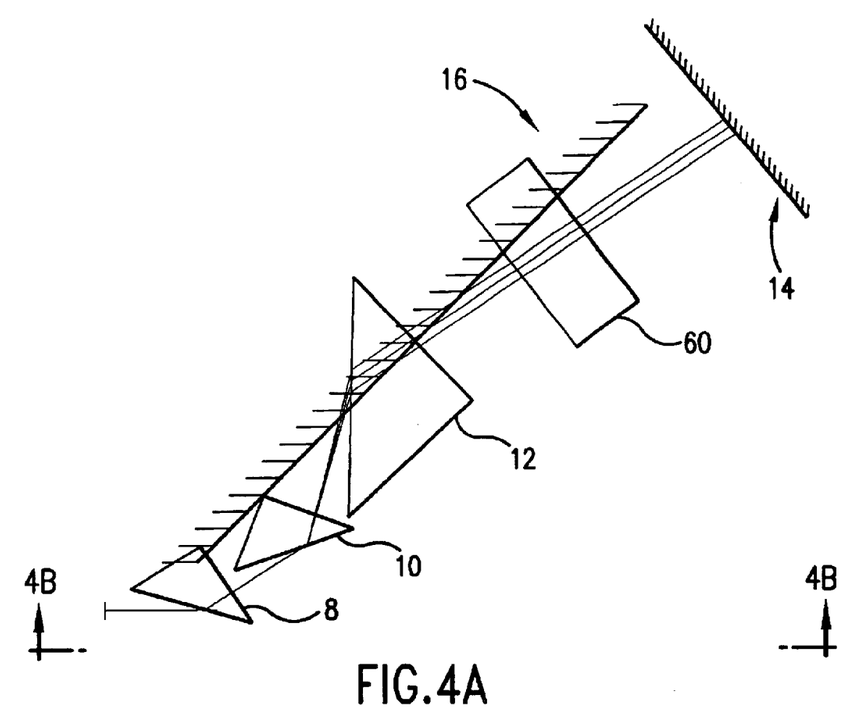
FIGS. 4A, 4B and 4C show elements of a preferred embodiment of the present invention.
Figure 4B:
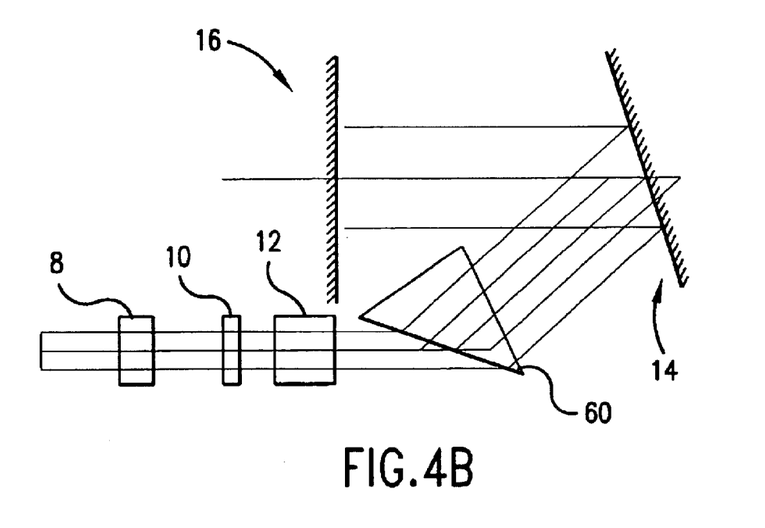
Figure 4C:
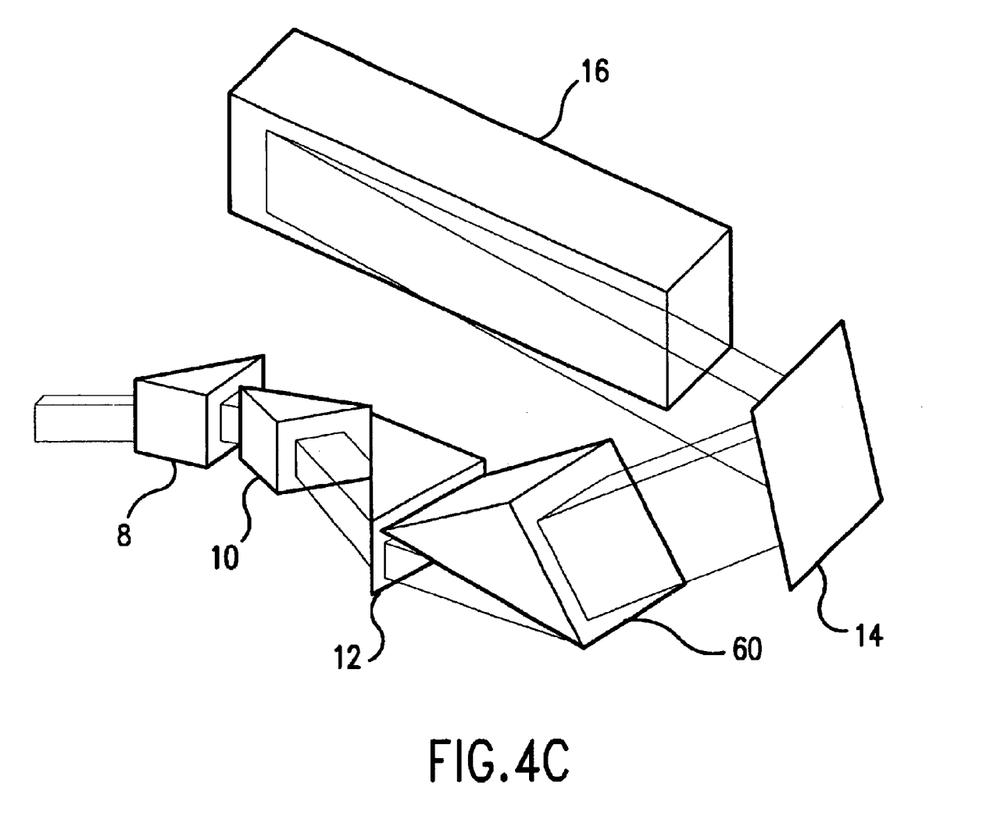

A preferred line narrowing module of the present invention is shown in FIGS. 4A, B and C. It has three beam expanding prisms that expand the beam in the horizontal direction and one additional prism, which expands the beam in the vertical direction.

FIG. 4A is a top view. FIG. 4B is a side view from the side indicated in FIG. 4A. (In FIG. 4B the prisms are depicted as rectangles representing the portion of the prisms through which the center of the beam passes.) FIG. 4C is a prospective view. Note that the grating 16 and mirror 14 are at a higher elevation than prisms 8, 10, and 12. Note that the expanded beam heads off in a direction out of the plane of the horizontal beam expansion. The beam then is redirected back into a second horizontal plane parallel to the plane of the horizontal expansion by mirror 14 onto the face of the grating 16 which is positioned in the Littrow configuration in the second horizontal plane. (Grating 16 is shown as a line in FIG. 4B representing the intersection of the horizontal center of the beam with the grating surface.)

In the preferred embodiment, each of the three horizontally expanding prisms expands the beam by about 2.92 times. Therefore, total beam expansion in the horizontal direction is $2.92^3$=25 times. The beam expansion in the vertical direction is 1.5 times. (The degree of expansion is exaggerated in FIGS. 4B and C.) This vertical beam expansion does not directly affect the beam divergence in the laser cavity or the vertical beam divergence of the output laser beam, but it does reduce the vertical divergence of the beam as it illuminates the grating surface. After the beam is reflected from the grating, prism 60 contracts the beam in its vertical direction as it passes back through the prism thus increasing its divergence back to normal. This reduced divergence of the beam as it illuminates the grating results in a reduction in the wavelength shift effect thus producing better line-narrowing. A vertical tilt of 1 mrad of the beam before it goes through this prism is reduced to $$\frac{1 \text{mrad}}{1.5} = 0.67 \text{ mrad}.$$

According to FIG. 3, this will correspond to wavelength shift reduction from 0.1 pm to a mere 0.044 pm making this effect insignificant for line narrowing of the next generation of lasers.

Figure 5:
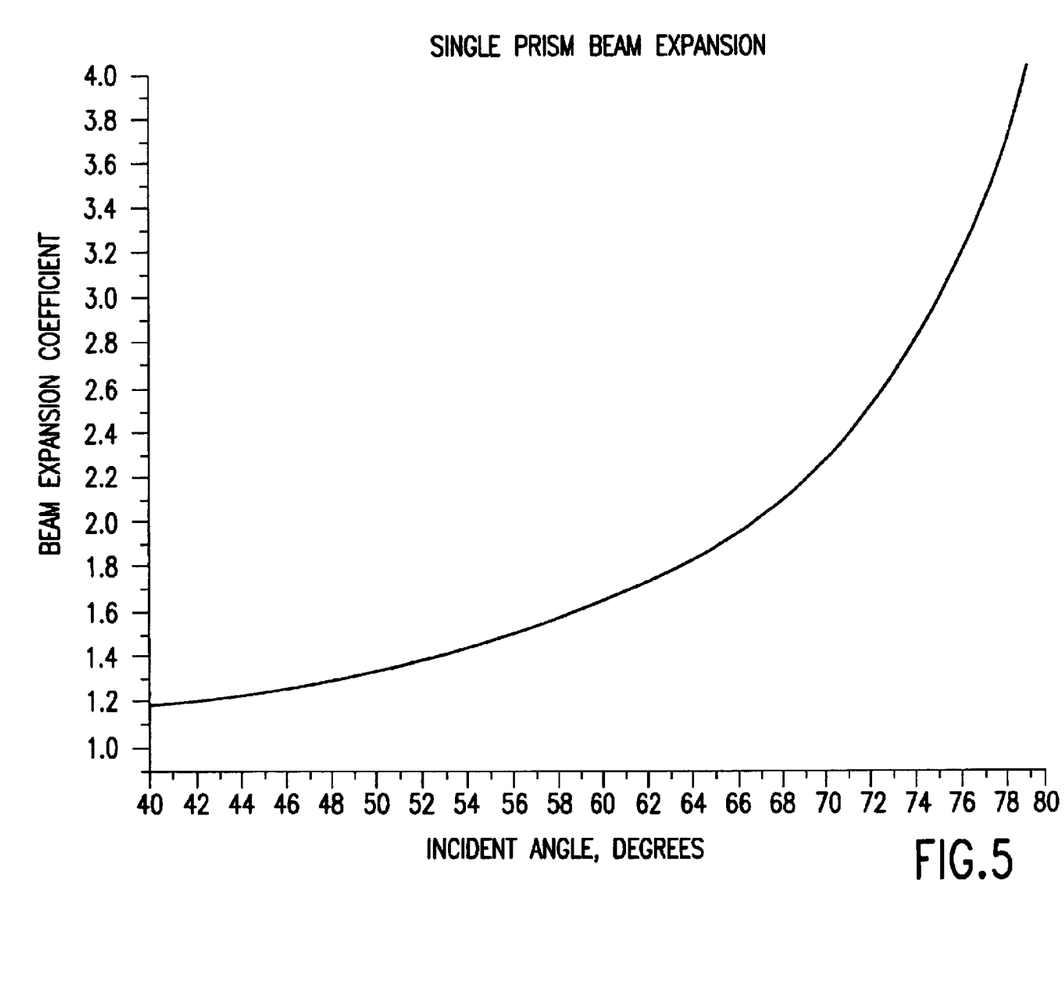
FIG. 5 shows beam expansion coefficient possible with one prism.
Figure 6:
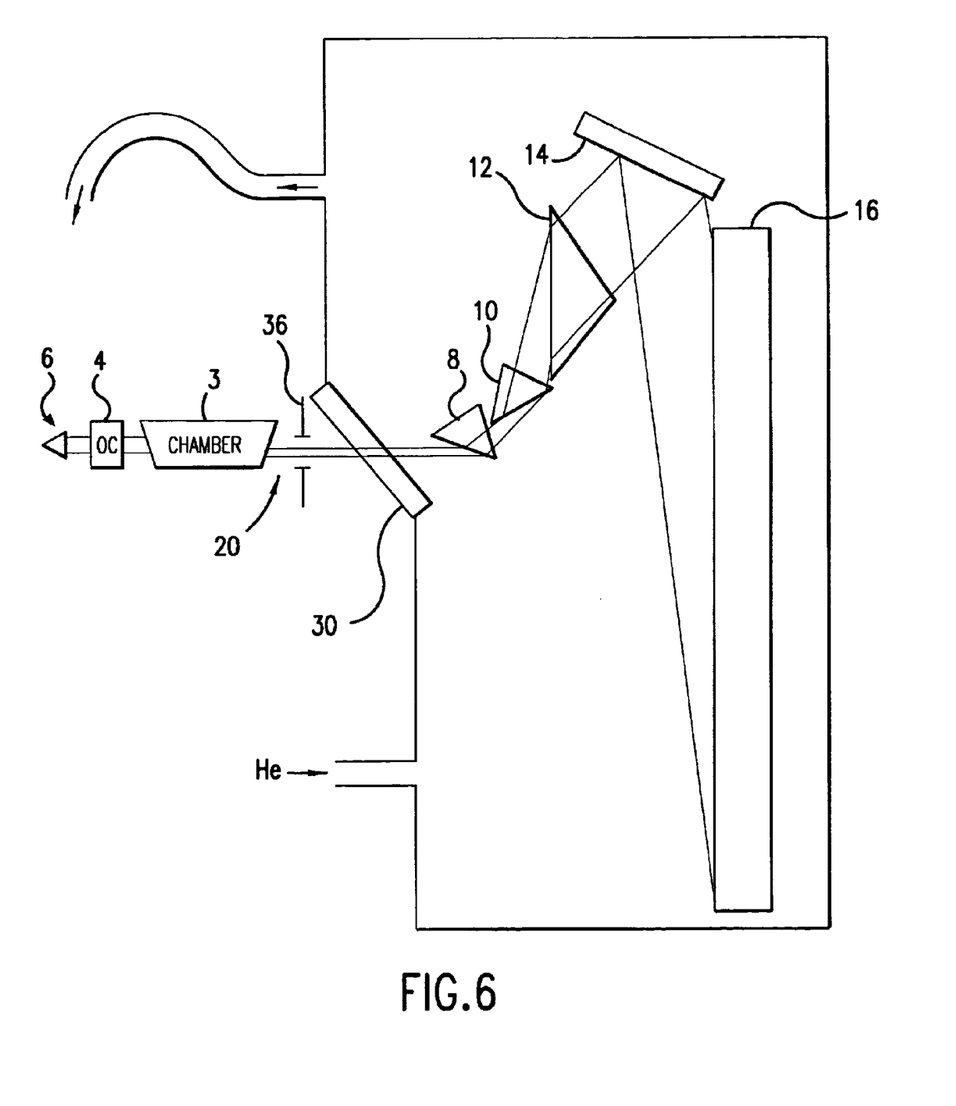
FIG. 6 shows a helium purge arrangement.
Figure 7:
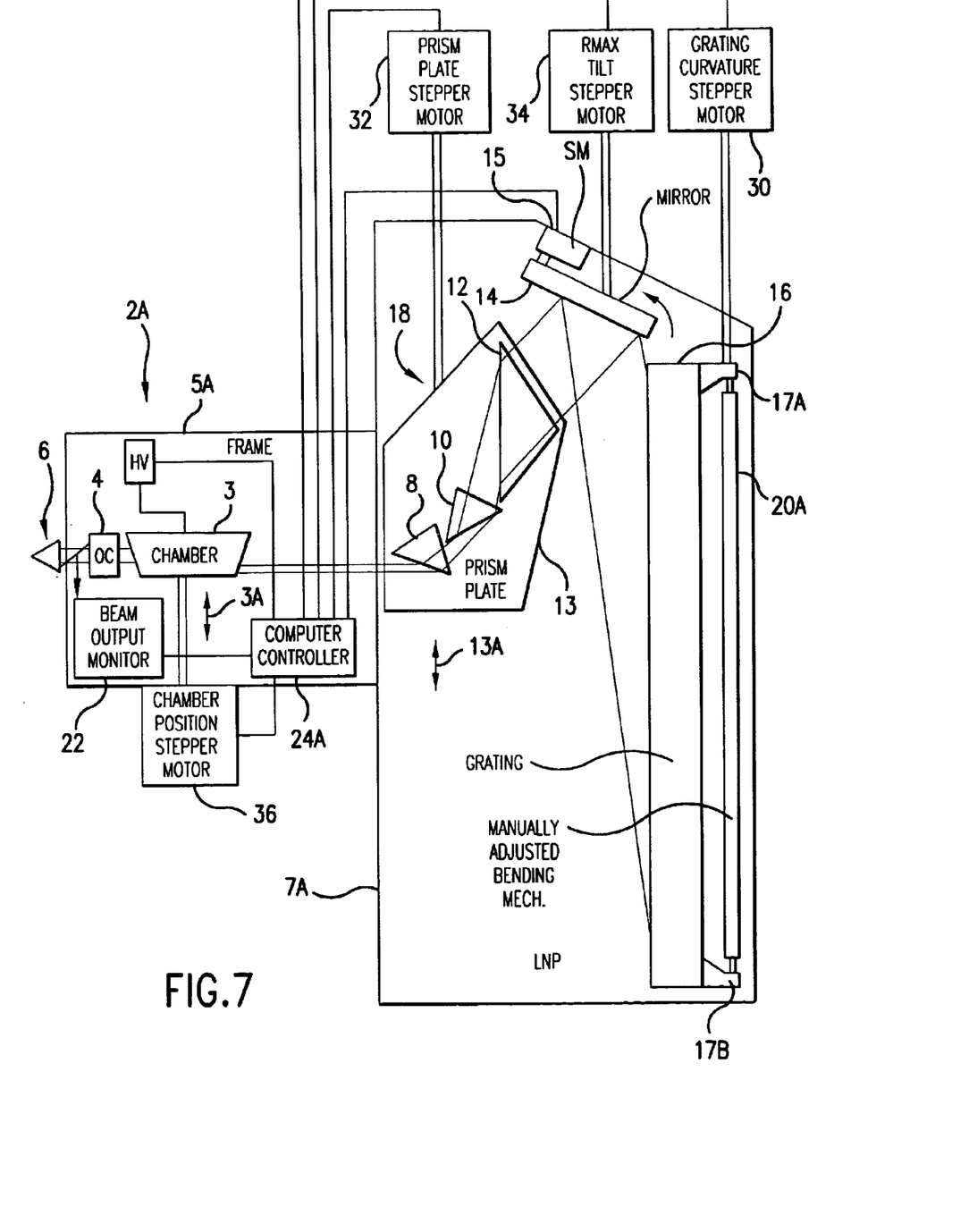
FIGS. 7, 8 and 8A–D show LNP's equipped for fast feedback control.
Figure 8:
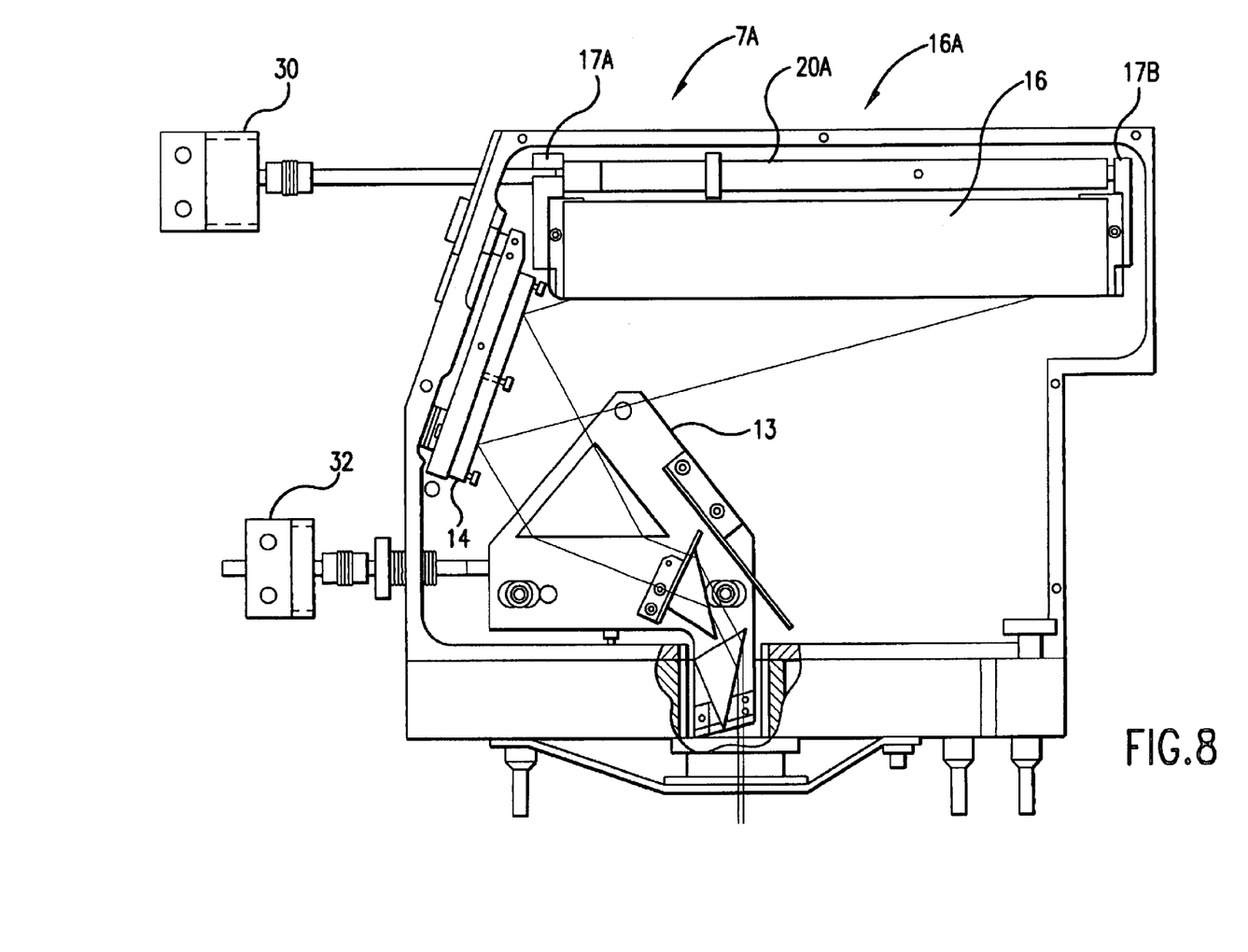
Figure 8A:
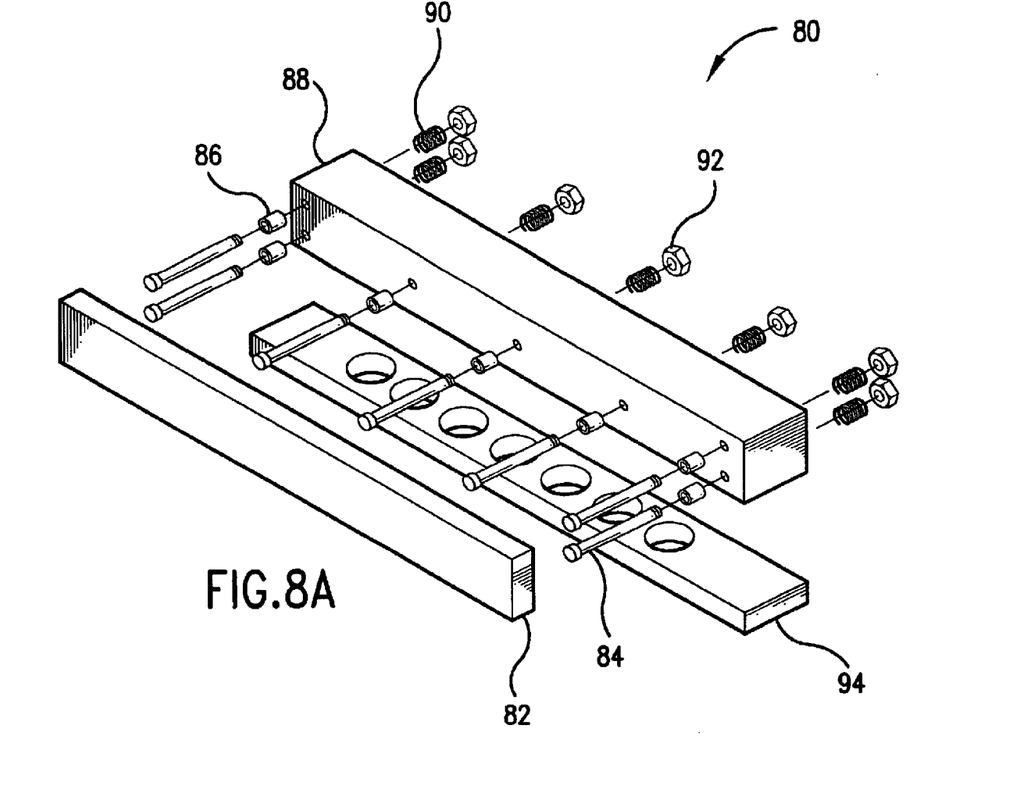
Figure 8B:
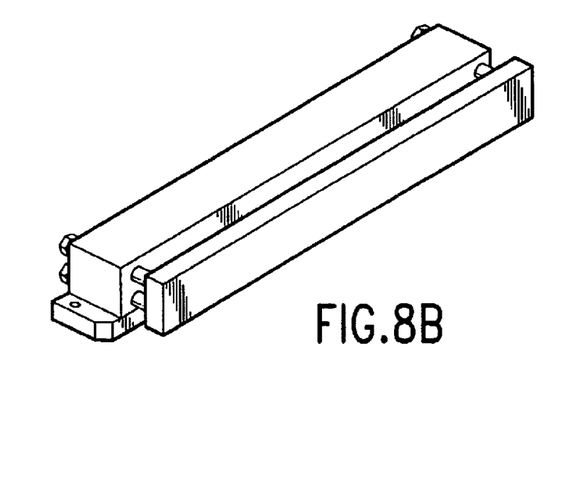
Figure 8C:
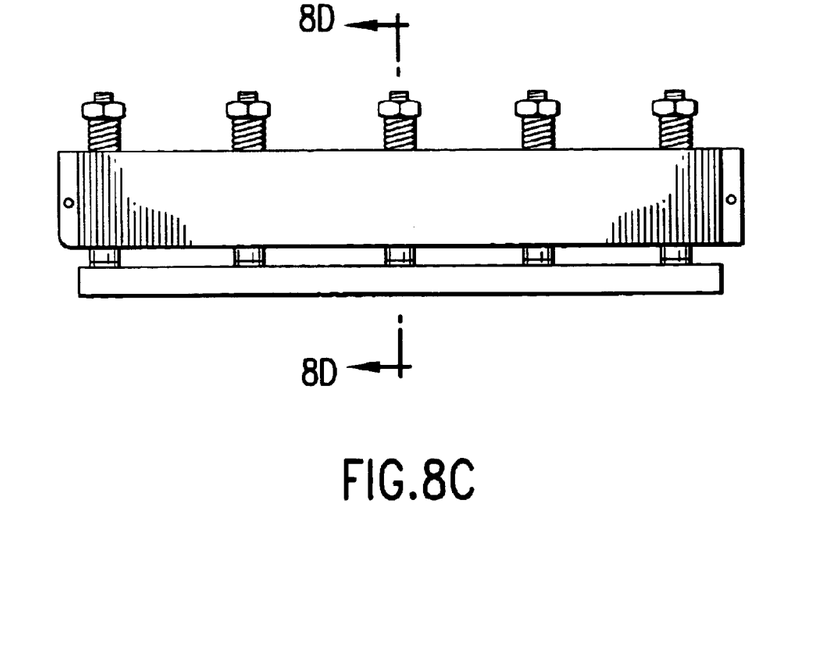
Figure 8D:
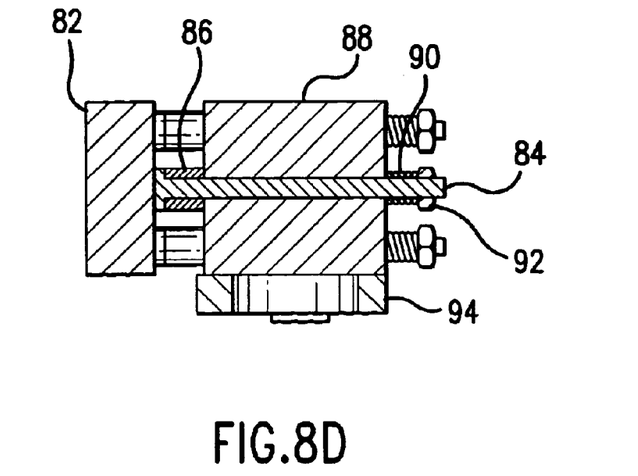

Persons skilled in the art will recognize that in addition to the above-described specific embodiments of the present invention, there are many other embodiments. For example, prism 60 can be placed before prism 8, or between any two of prisms 8, 10, and 12. Prism combinations other than 3 prisms for horizontal beam expansion and 1 prism for vertical beam expansion can be used as well. Techniques for substantially real time control of several wavelength parameters are described in a United States patent application filed Sep. 3, 1999, Ser. No. 09/390,579 and in a United States patent application filed Oct. 31, 2000, Ser. No. 09/703,317 which are incorporated by reference herein. These techniques include fast feedback control of the position of the beam expanding prisms, grating curvature and tuning mirror position. Control of the position of the laser chamber is also provided. FIG. 6 shows an LNP with helium purge. FIG. 7 is a combination block diagram schematic drawing of the entire laser system and FIGS. 8A and 8B are drawings of the LNP with the added feedback control features. In the FIG. 8 embodiment, the curvature of the grating is controlled by grating curvature stepper motor 30 to compensate for the distortion caused by the hot gas layer on the face of the grating. In the FIGS. 8A–D embodiment, the curvature of grating 82 is controlled with seven piezoelectric devices 86 acting through seven invar rods 84 against backing block 88 and compression spring 90. This embodiment provides very fast adjustment of the curvature of the grating face. FIG. 5 shows possible beam expansion coefficients that can be achieved with a single prism by adjusting the incident angle. The scope of the present invention should be determined by the appended claims and their legal equivalents.

We claim:

1. A bidirection beam expansion line narrowing unit for a laser defining a laser chamber comprising:

A) first direction beam expander positioned to receive a beam from said laser chamber said beam defining a generally rectangular cross-section and to expand the cross-section of the beam from said laser in a first direction;

B) a second direction beam expander positioned to expand said beam in a second direction; and C) a grating positioned to reflect a selected narrow band of wavelengths back, via said second direction beam expander and said first direction beam expander, to said laser chamber for amplification.

2. A line narrowing unit as in claim 1 wherein said first direction is horizontal and said second direction is vertical.

3. A line narrowing unit as in claim 1 wherein said first direction beam expander is comprised of at least one prism and said second direction beam expander is comprised of at least one prism.

4. A line narrowing unit as in claim 1 wherein said first direction beam expander is comprised of three prim and said second direction beam expander is comprised of a single prism.

5. A line narrowing unit as in claim 1 and further comprising a tuning mirror.

6. A narrow band excimer laser comprising:
A) a laser chamber comprising
  1) two electrodes;
  2) an excimer laser gas;
  3) a blower means for circulating the gas;
  4) a pulse power means for creating discharges between said electrodes to produce excimer laser pulses;
B) a resonant cavity comprising an output coupler and a line narrowing unit said line narrowing unit comprising;
  1) first direction beam expander positioned to receive a beam from said laser chamber said beam defining a generally rectangular cross-section and to expend the cross-section of the beam from said laser in a first direction;
  2) a second direction beam expander positioned to expand the cross-section of said beam in a second direction; and
  3) a grating positioned to reflect a selected narrow band of wavelengths back, via said second direction beam expander and said first direction beam expander, to said laser chamber for amplication.

7. A laser as in claim 1 wherein said first direction and said second direction are generally orthogonal.

8. A laser as in claim 1 wherein said first direction beam expander is comprised of at least one prism and said second direction beam expander is comprised of at least one prism.

9. A laser as in claim 1 wherein said first direction beam expander is comprised of three prisms and said second direction beam expander is comprised of a single prism.

10. A laser as in claim 1 and further comprising a tuning mirror.

* * * * *